(12) United States Patent
Liu et al.

(10) Patent No.: US 7,154,294 B2
(45) Date of Patent: Dec. 26, 2006

(54) COMPARATORS CAPABLE OF OUTPUT OFFSET CALIBRATION

(75) Inventors: Zhongding Liu, Beijing (CN); Joe Bi, Beijing (CN); Ken-Ming Li, Taipei (TW); Gray Pan, Beijing (CN); Gary Yang, Beijing (CN)

(73) Assignee: Via Technologies Inc., Taipei (TW)

( * ) Notice: Subject to any disclaimer, the term of this patent is extended or adjusted under 35 U.S.C. 154(b) by 152 days.

(21) Appl. No.: 11/063,762

(22) Filed: Feb. 23, 2005

(65) Prior Publication Data
US 2006/0186928 A1    Aug. 24, 2006

(51) Int. Cl.
*H03K 17/16* (2006.01)
(52) U.S. Cl. .................. 326/27; 326/83; 326/115
(58) Field of Classification Search .................. 326/26, 326/27, 82–87, 112, 115, 119
See application file for complete search history.

(56) References Cited

U.S. PATENT DOCUMENTS

| 6,437,599 B1* | 8/2002 | Groen .................. 326/63 |
| 6,704,365 B1* | 3/2004 | Haycock .................. 375/257 |
| 6,825,707 B1* | 11/2004 | Viehmann et al. .......... 327/407 |

* cited by examiner

*Primary Examiner*—Don Le
(74) *Attorney, Agent, or Firm*—Thomas, Kayden, Horstemeyer & Risley

(57) ABSTRACT

Comparators outputting offset calibration. A MOS current mode logic (MCML) circuit receives input signals and generates differential logic signals on output terminals thereof, and comprises a calibration unit coupled to the output terminals, calibrating output offsets at the output terminals according to digital calibration codes. An output stage is coupled to the differential logic signals at the output terminals of the MCML circuit to amplify the differential logic signal and generating a comparison resulting signal. By adjusting the digital calibration codes applied to the calibration unit, current on the output terminals can be adjusted, such that output offsets at the output terminals of the MCML circuit 10 can be eliminated.

24 Claims, 8 Drawing Sheets

COMPARATORS CAPABLE OF OUTPUT OFFSET CALIBRATION

BACKGROUND

The invention relates to comparators, and more particularly, to comparators outputting offset calibration.

In various analog/digital converters (ADC) such as flash ADC, interpolation ADC, pipeline ADC and two-step ADC and high speed receivers such as PCI express receivers and DVI receivers, high speed comparators are often required to fulfill the requirements of high speed operation of the digital circuit.

Differential logic circuits, such as MOS current mode logic (MCML) circuits, are suitable for high speed systems because of high switching speed and low power consumption. FIGS. 1a and 1b are circuit diagrams of conventional MCML circuits. If the threshold voltage (Vth) of the transistor MN1 differs from that of the transistor MN2, output signal of the MCML circuit becomes unbalanced by bias offset voltages. Namely, the MCML circuit includes output offsets at the output terminal thereof. The MCML circuit may operate improperly if the minimum differential output voltage is too low. Thus, the maximum operating frequency and resolution power of the MCML circuit are limited by manufacturing fluctuations, such as fluctuations of the threshold voltage (Vth) of the differential pair transistors. Further, the output common mode level of MCML circuit is inconsistent.

SUMMARY

An exemplary comparator outputting offset calibration, in which a MOS current mode logic (MCML) circuit receives input signals and generates differential logic signals on output terminals thereof, comprises a calibration unit coupled to the output terminals, calibrating output offsets at the output terminals according to digital calibration codes. An output stage is coupled to the differential logic signals at the output terminals of the MCML circuit to amplify the differential logic signal and generate a comparison resulting signal.

An exemplary MOS current mode logic (MCML) circuit is further disclosed, in which a differential input stage includes two input terminals receiving input signals and a common node, and generating two corresponding output signals at two output terminals in a sampling mode. A latch unit is coupled to the sampling stage to generate differential logic signals at the two output terminals, according to the two output signals from the differential input stage, in a comparison mode. A calibration unit is coupled to the output terminals to calibrate output offsets at the output terminals according to digital calibration codes.

DESCRIPTION OF THE DRAWINGS

The invention can be more fully understood by the subsequent detailed description and examples with reference made to the accompanying drawings, wherein.

DETAILED DESCRIPTION

Figure 1A:
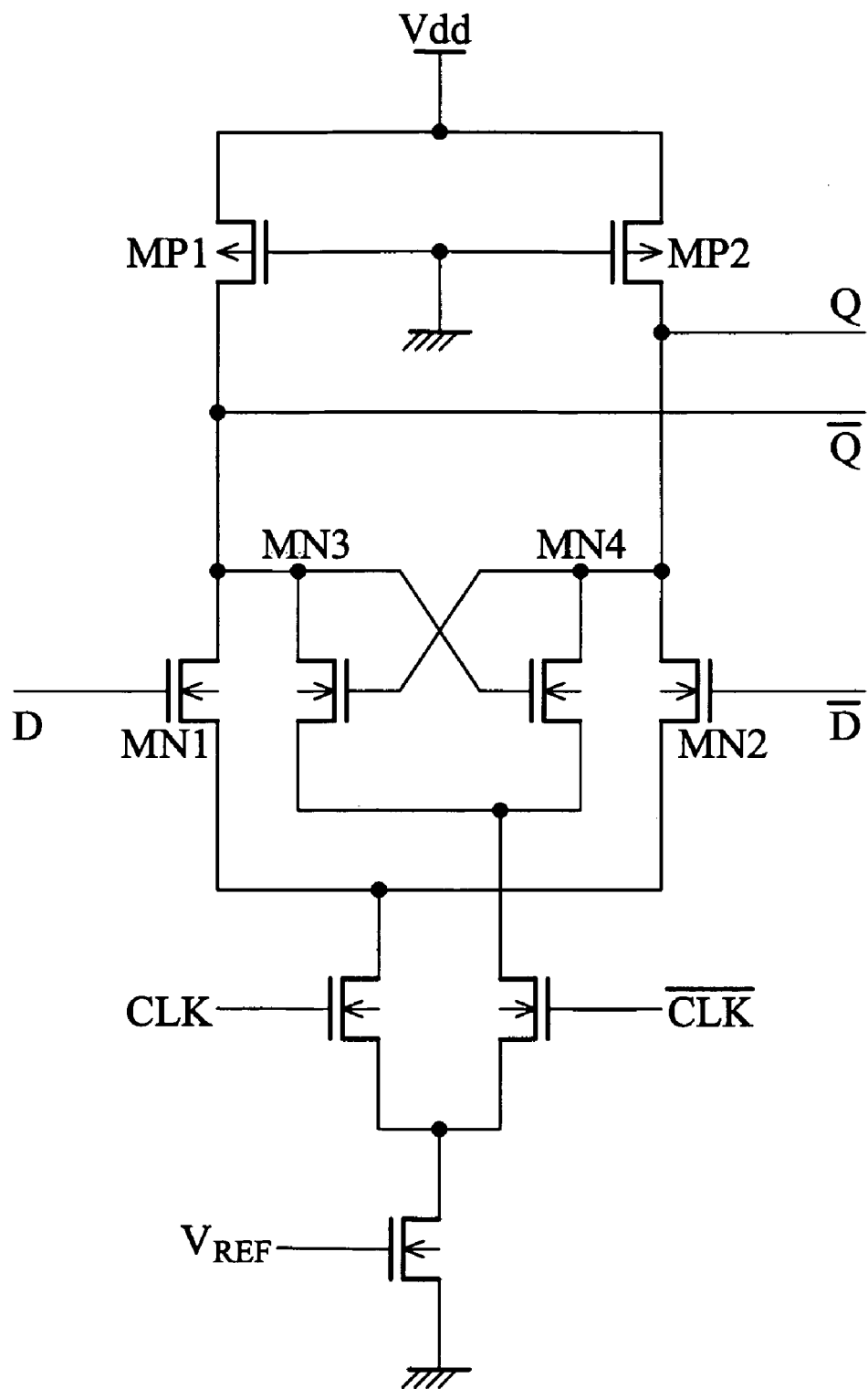
FIG. 1A shows a conventional MCML circuit.
Figure 1B:
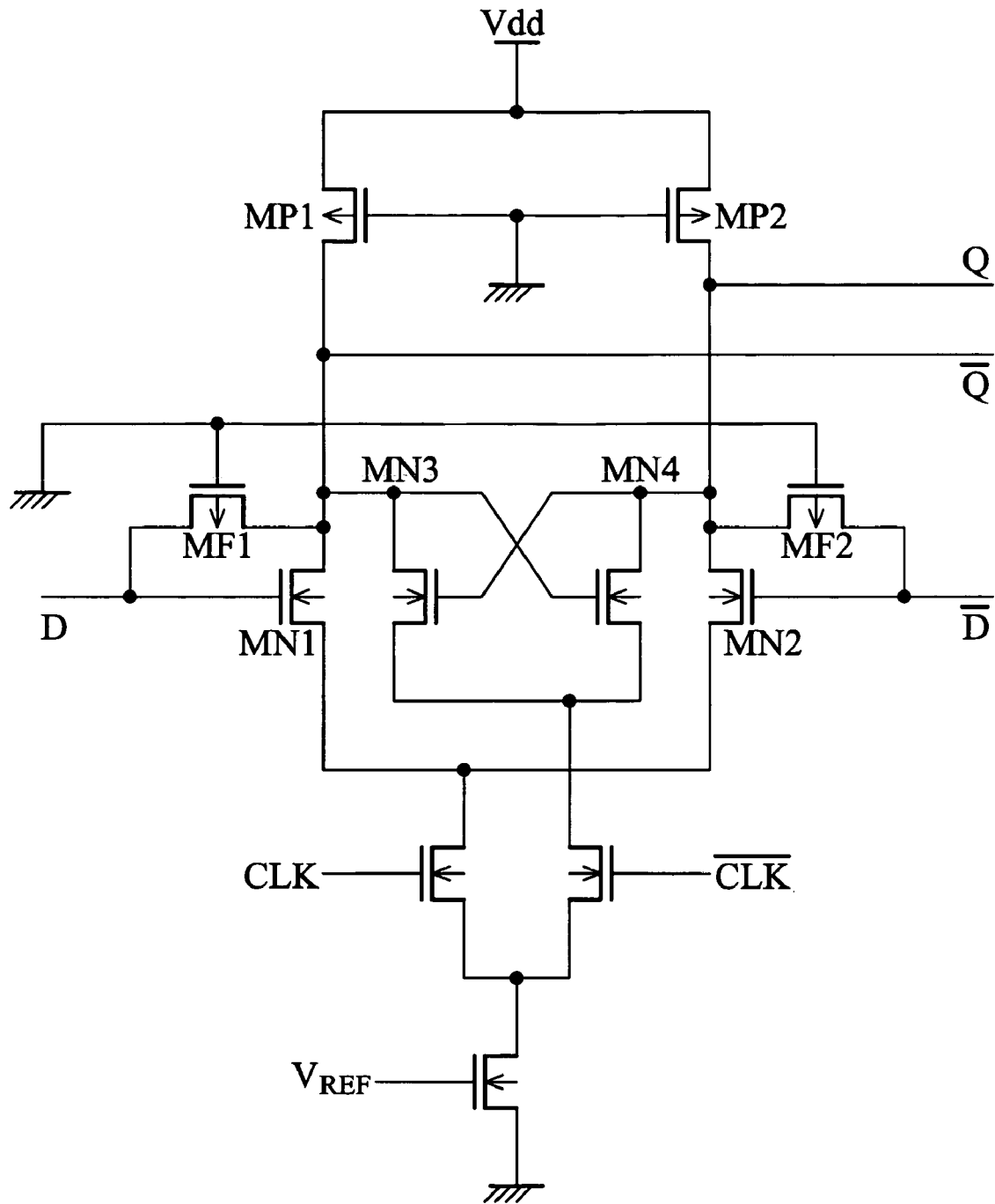
FIG. 1B shows a conventional feedback conventional MCML circuit.
Figure 2:
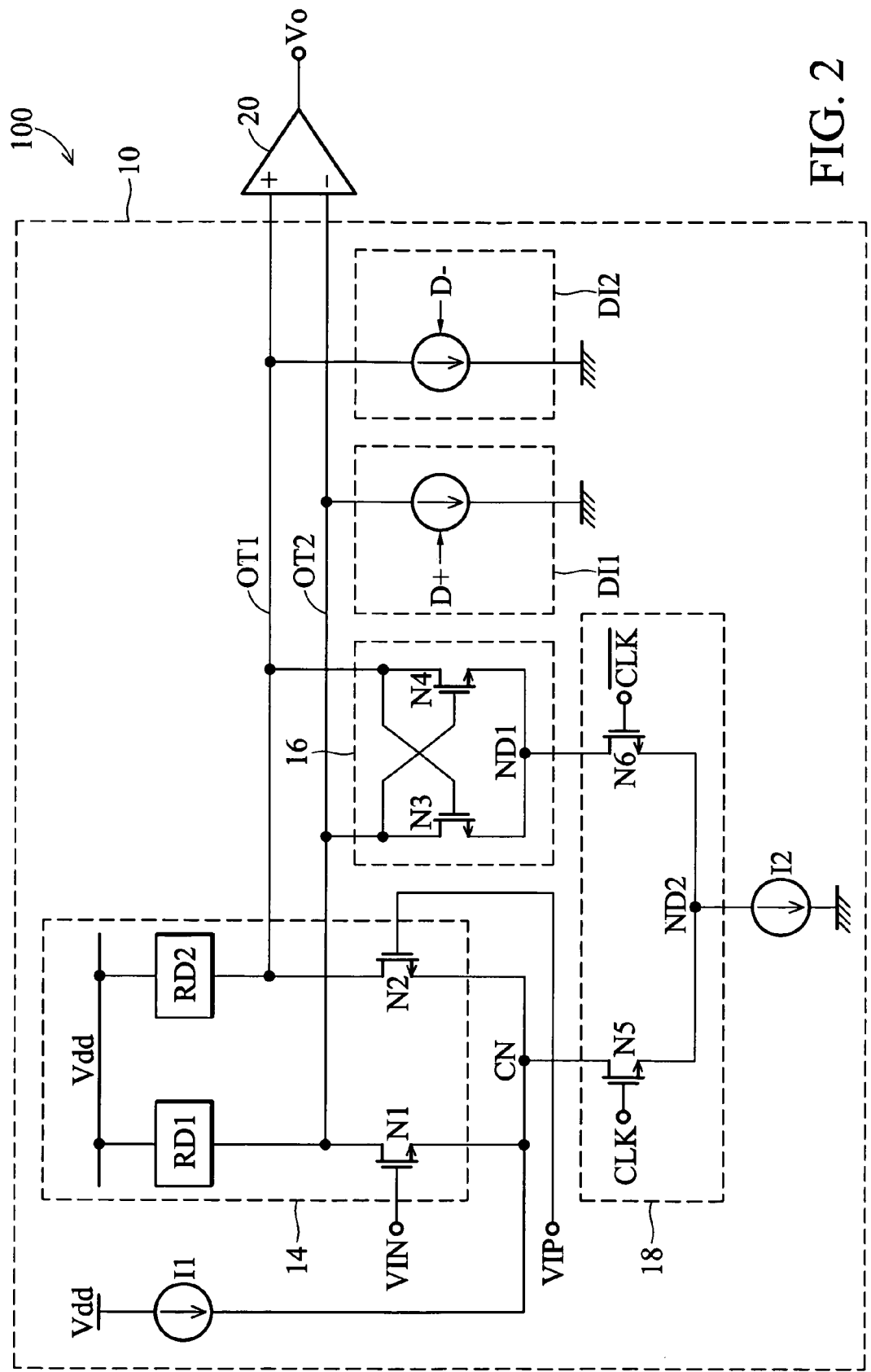
FIG. 2 shows an exemplary compactor.
Figure 3:
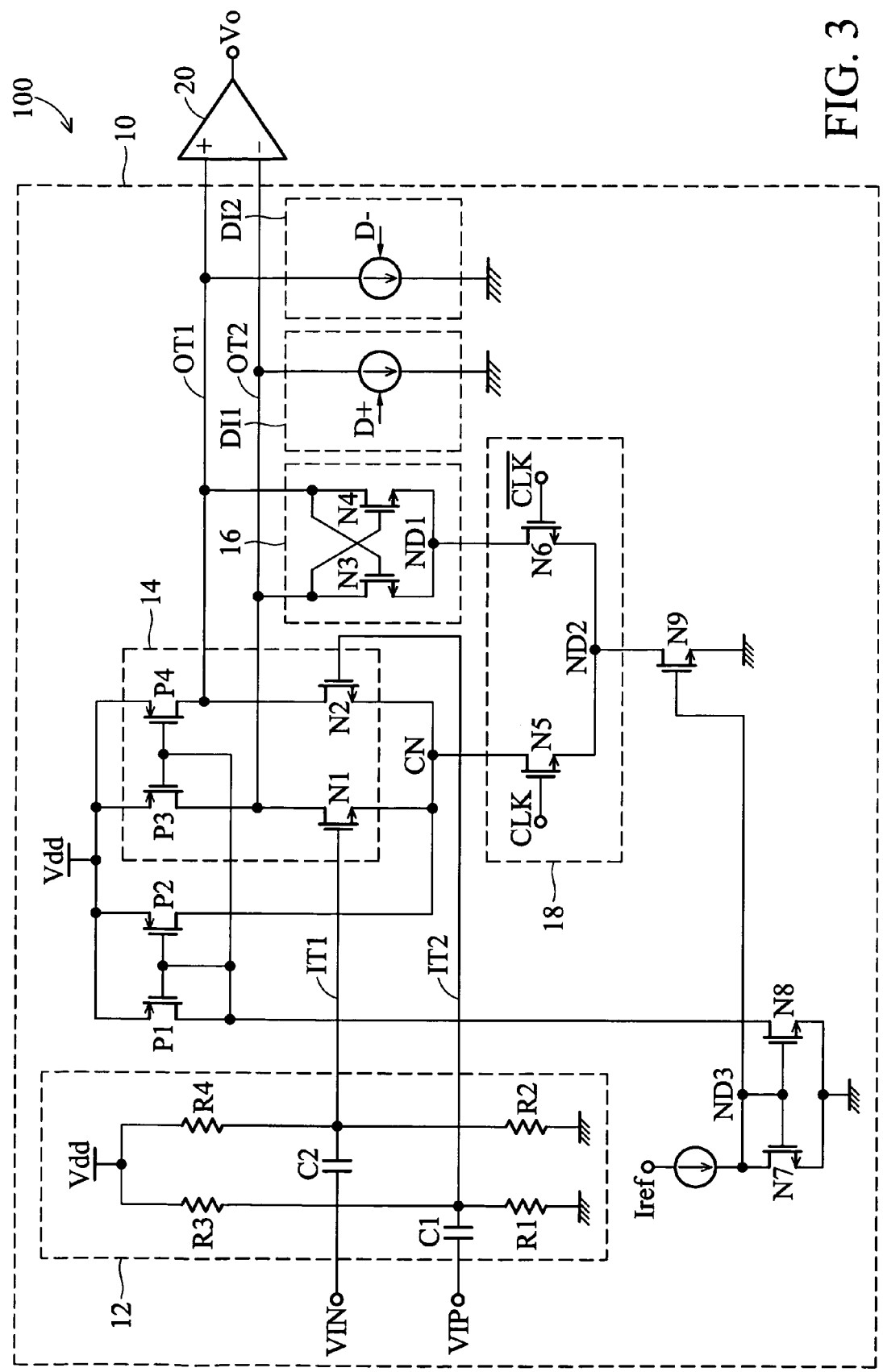
FIG. 3 is an exemplary circuit diagram of a MCML circuit.

FIG. 2 shows an exemplary compactor, and FIG. 3 is an exemplary circuit diagram of a MCML circuit. As shown in FIGS. 2 and 3, the comparator 100 comprises a MCML circuit 10 and an output stage 20.

The MOS current mode logic (MCML) circuit receives input signals VIN and VIP and generates differential logic signals on output terminals OT1 and OT2. The MCML circuit 10 comprises a coupling unit 12 (only in FIG. 3), a differential input stage 14, a latch unit 16, a differential pair 18, a current source I2 (only in FIG. 2), a calibration unit (DI1 and DI2) and means (I1) (only in FIG. 2) for pulling high the common node CN to the power voltage Vdd in a comparison mode.

The coupling unit 12 is coupled to input terminals IT1 and IT2 of the differential input stage 14 to couple the input signals VIN and VIP to the differential input stage 14. As shown in FIG. 3, the coupling unit 12 comprises resistors R1–R4 and capacitors C1 and C2.

The differential input stage 14 receives the input signal VIN and VIP to generate corresponding output signal at the output terminals OT1 and OT2 in a sampling mode. The differential input stage 14 comprises two load elements RD1 and RD2 and transistors N1 and N2. The load element RD1 is coupled between the power voltage and the drain terminal of the NMOS transistor N1, and the load element RD2 is coupled between the power voltage and the drain terminal of the NMOS transistor N2. The NMOS transistor N1 comprises a source terminal coupled to the common node CN and a gate terminal coupled to the input signal VIN. The NMOS transistor N2 comprises a source terminal coupled to the common node CN and the drain of the source terminal of the NMOS transistor N1, and a gate terminal coupled to the input signal VIP. As shown in FIG. 3, the PMOS transistors P1 and P3 constitute a current source serving as the load element RD1, and the PMOS transistors P1 and P4 constitute another current source serving as the load element RD2.

The latch unit 16 is coupled to the differential input stage, generating the differential logic signals at the output terminals OT1 and OT2, according to the two output signals from the differential input stage 14, in a comparison mode. The latch unit 16 comprises two cross-coupled differential transistors N3 and N4. The NMOS transistor N3 comprises a source terminal coupled to a node ND1, a drain terminal coupled to the output terminal OT2 and a gate terminal coupled to the drain terminal of the NMOS transistor N4. The NMOS transistor N4 comprises a source terminal coupled to the node ND1, a gate terminal coupled to the drain terminal of the NMOS transistor N3, and a drain terminal coupled to the output terminal OT1.

The differential pair 18 comprises two NMOS transistors N5 and N6. The NMOS transistor N5 comprises a drain terminal coupled to the common node CN of the differential input stage 14, a source terminal coupled to a node ND2, and a gate terminal coupled to a clock signal CLK. The NMOS transistor N6 comprises a drain terminal coupled to the node ND1, a source terminal coupled to the node ND2, and a gate terminal coupled to the clock signal /CLK, wherein the clock signal CLK is an inversion signal of the clock signal /CLK. The current source I2 is coupled between the node N2 and ground voltage GND. As shown in FIG. 3, the NMOS transistors N7 and N9 constitute the current I2, in which gate terminal of the transistors N7 and N9 are coupled to a node ND3.

The current source I1 is coupled between the power voltage Vdd and the common node CN of the differential input stage 14, pulling the common node CN to the power voltage Vdd in a comparison mode. As shown in FIG. 3, the PMOS transistors P1 and P2 constitute the current source I1, pulling the common node CN to the power voltage Vdd in the comparison mode. The NMOS transistors N7 and N8 constitute a bias current source to provide the reference current Iref to the PMOS transistors P1–P4. The common mode voltage between the terminals OT1 and OT2 is kept steady by setting the current through the transistor N9 exceeding 2 times of that through transistors P3 and P4, such that the transistors P3 and P4 are set in linear region.

The digital controlled current sources DI1 and DI2 are coupled between the output terminals OT1 and OT2 and the ground voltage GND to serve as the calibration unit for calibrating output offsets at the output terminals OT1 and OT2 according to digital calibration codes D+ and D−. For example, if the digital calibration codes are divided into a first set of calibration codes D+ and a second set of calibration codes D−, FIG. 4 shows an exemplary circuit diagram of a digital controlled current source.

Figure 4:
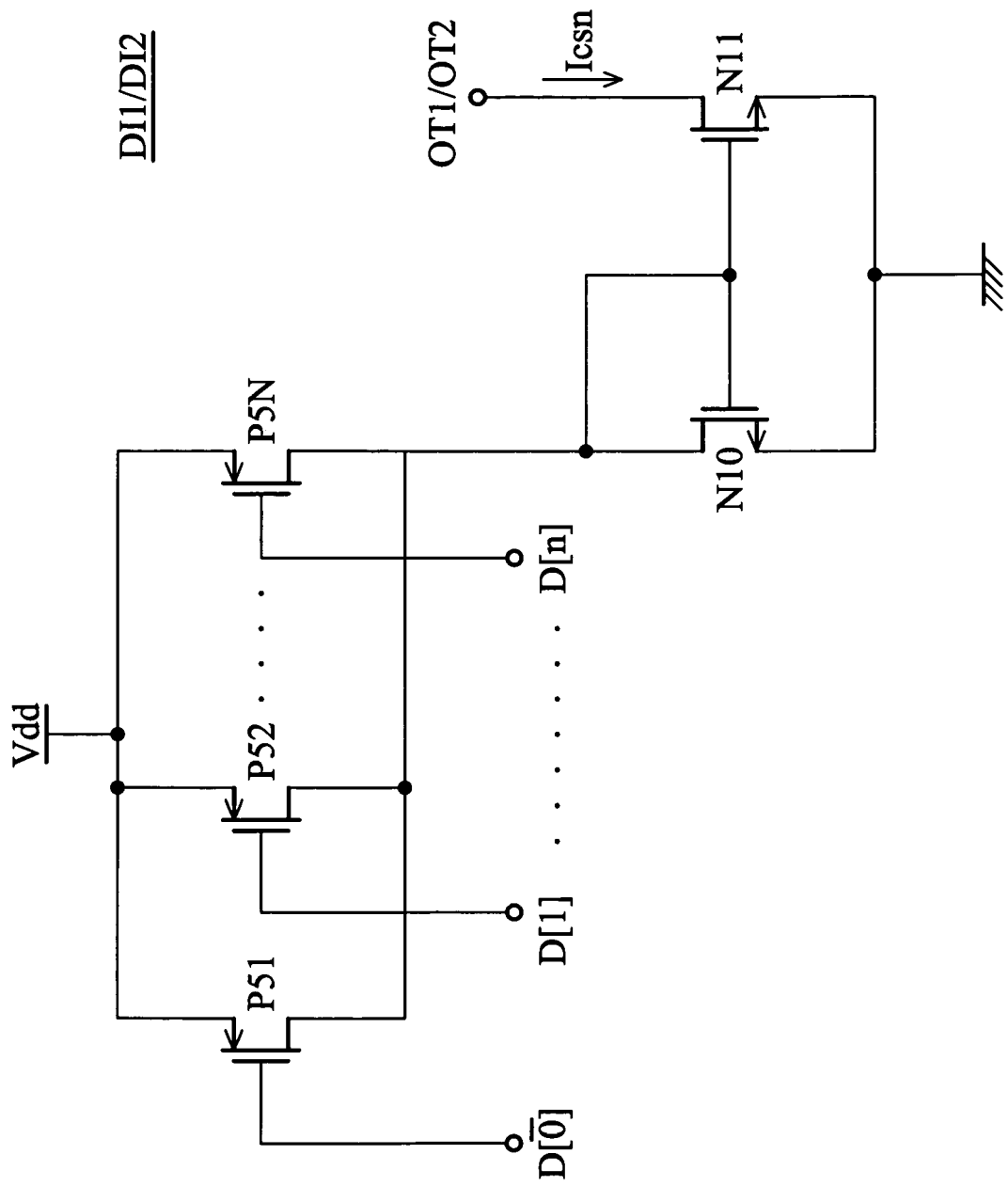
FIG. 4 is an exemplary circuit diagram of a digital controlled current source.

As shown in FIG. 4, the digital controlled current source DI1/DI2 comprises a plurality of PMOS transistors P51–P5N and NMOS transistors N10 and N11. The PMOS transistors P51–P5N are connected in parallel, the source terminals of the PMOS transistors P51–P5N are coupled to the power voltage Vdd, the drain terminals of which are coupled to the drain terminal of the NMOS transistor N10, and gate terminals of which are coupled to digital calibration codes D[0], D[1], . . . , D[n] (one set of digital calibration codes D− or D+). The NMOS transistor N10 comprises a drain terminal coupled to the drain terminals of the PMOS transistors P51–P5N, a source terminal coupled to the ground voltage GND, and a gate terminal coupled to the drain terminal thereof and the gate of the NMOS transistor N11. The NMOS transistor N11 comprises a source terminal coupled to the ground voltage GND, a gate terminal coupled to the gate terminal of the NMOS transistor N10, and a drain terminal coupled to the output terminal OT1/OT2. By amending the digital calibration codes D[0], D[1], . . . , D[n], the current $I_{CSN}$ through the NMOS transistor N11 can be tuned and thus, the current on the output terminal OT1/OT2 can also be adjusted.

Figure 5:
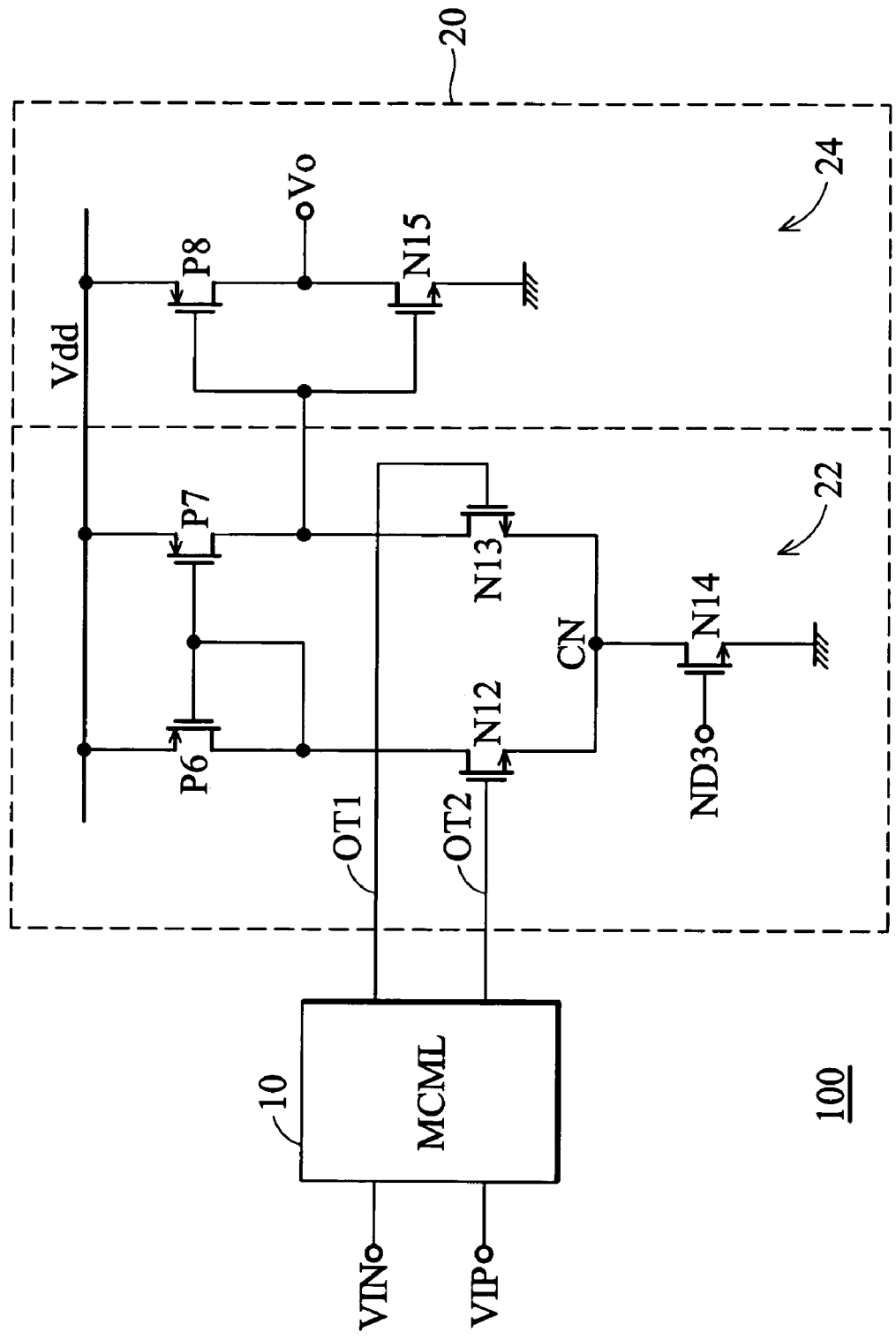
FIG. 5 is an exemplary circuit diagram of an output stage.

The output stage 20 is coupled to output terminals OT1 and OT2 to receive the differential logic signals, amplify the differential logic signals and generate a comparison resulting signal Vo. FIG. 5 shows an exemplary circuit diagram of an output stage. As shown in FIG. 5, the output stage 20 comprises a differential amplification unit 22 and a buffer 24. The differential amplification unit 22 is coupled to the output terminal OT1 and OT2 to amplify the differential logic signals from the latch unit 16 and generate the comparison resulting signal Vo. The differential amplification unit 22 comprises PMOS transistors P6 and P7, NMOS transistor N12–N14, in which the gate terminal of the transistor N14 is coupled to the node ND3 in the MCML circuit 10. The buffer 24 comprises an input terminal coupled to the drain terminals of the PMOS transistor P7 and the NMOS transistor N13 to buffering the comparison resulting signal Vo.

Operations of the comparator 100 are described in the following with reference to FIG. 3.

Figure 6A:
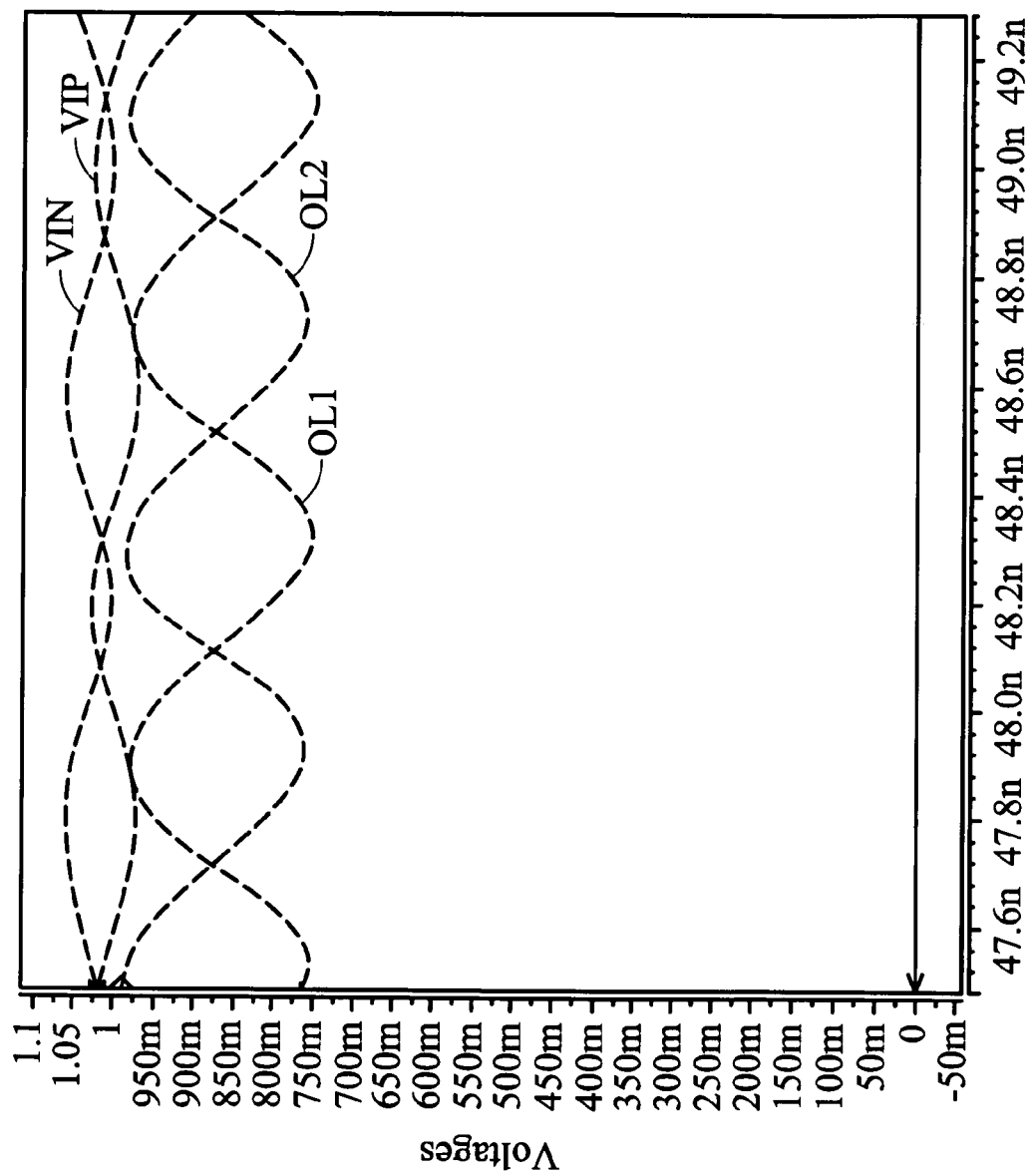
FIGS. 6A and 6B are wave diagrams illustrating differential logic signals of the comparators.

Initially, the same input signals VIN and VIP are applied to the input terminals IT1 and IT2 of the differential input stage 14, and the clock signal CLK is at high level or low level alternately, in calibration mode. If the threshold voltage (Vth) of the transistor N1 differs from that of the transistor N2, output signals at the MCML circuit 10 become unbalanced because of bias offset voltages. Namely, the MCML circuit 10 includes output offsets at the output terminals thereof. By adjusting the digital calibration codes D[0], D[1], . . . , D[n] applied to the digital controlled current sources DI1 and DI2, the current on the output terminals OT1 and OT2 can be adjusted, such that output offsets at the output terminals of the MCML circuit 10 can be eliminated, and thus, output signal at the MCML circuit 10 is balanced, output offsets at the output terminals of the MCML circuit 10 are eliminated, such that the optimum digital calibration codes D+ and D− are obtained. As shown in FIG. 6A, by applying the optimum digital calibration codes D+ and D− to the digital controlled current sources DI1 and DI2, the output signals at the MCML circuit 10 are balanced, wherein signals OL1 and OL2 present the differential signals at the output terminals OT1 and OT2 in calibration mode, and the output common mode level of MCML circuit 10 is steady at about 875 mV.

In sampling mode, the clock signals CLK and /CLK are at high level and low level respectively, the NMOS transistors N5 and N6 are turned on and off respectively, and the optimum digital calibration codes D+ and D− are applied to the digital controlled current sources DI1 and DI2. The differential input stage 14 is enabled to generate differential output signal at the output terminals OT1 and OT2 and the latch unit 16 is disabled because the NMOS transistors N5 and N6 are turned on and off respectively. The common node CN is pulled to low voltage with turning on of the transistor N5.

Figure 6B:
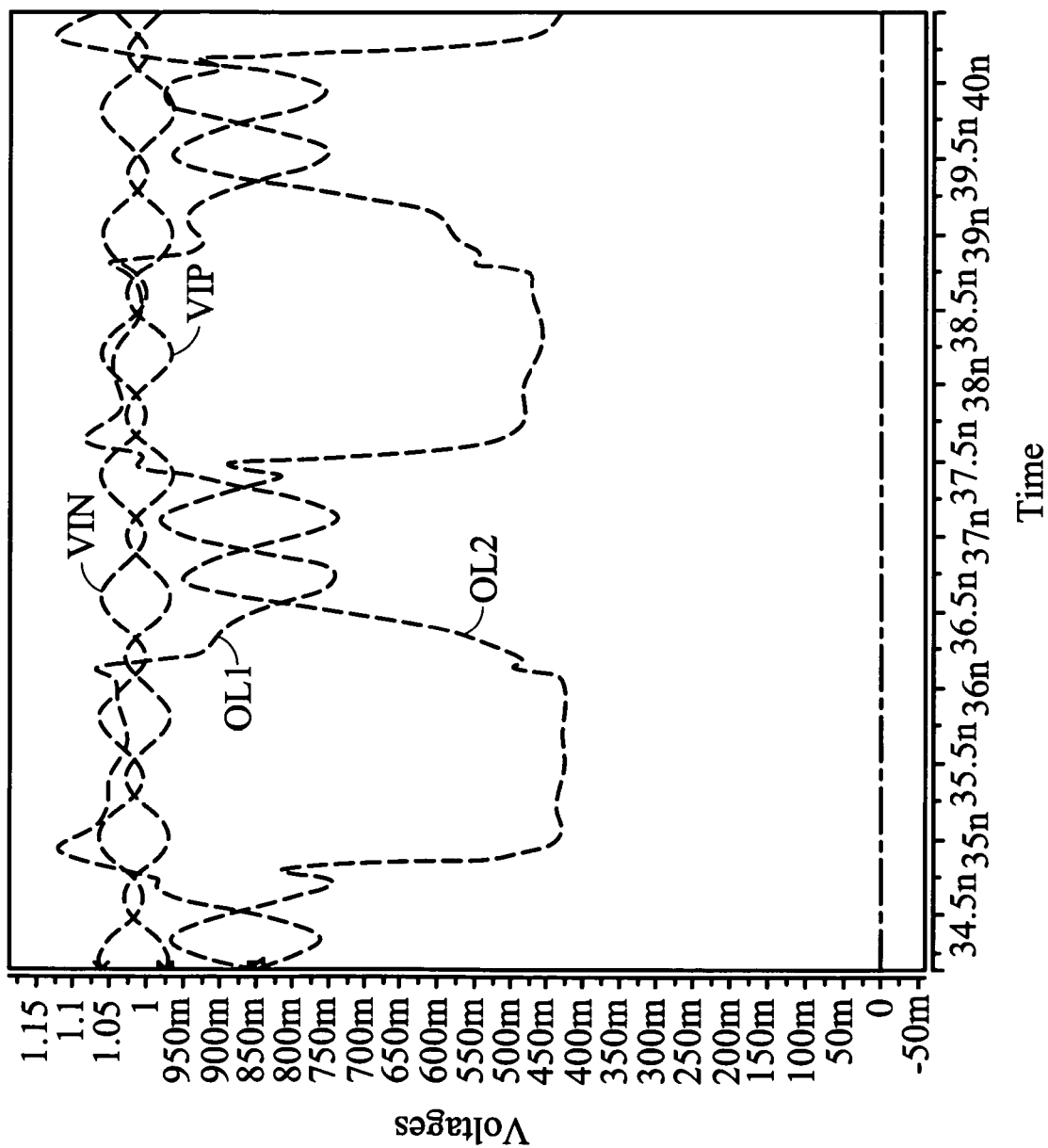

In comparison mode, the optimum digital calibration codes D+ and D− are also applied to the digital controlled current sources DI1 and DI2, the clock signals CLK and /CLK are at low level and high level respectively, and the NMOS transistors N5 and N6 are turned off and on respectively. Thus, the differential input stage 14 is disabled, and the latch unit 16 is enabled to latch and amplify the differential output signal generated by the NMOS transistors N1 and N2 to serve as differential logic signals, and output to the output stage 20. As shown in FIG. 6B, signals OL1 and OL2 present the differential logic signals at the output terminals Ot1 and OT2 in comparison mode. The output stage 20 amplifies the differential logic signals from the MCML circuit 10 and then generates a comparison resulting signal Vo.

Because the NMOS transistor N5 is turned off, the common node CN is pulled to the power voltage Vdd instantly by the PMOS transistor P2, such that the voltage level at the common node CN can be stabilized quickly and error caused by high slew rate input is reduced. Further, the resolution power of the comparator 100 is effectively enhanced because the output offset of the differential input stage 14 is eliminated by the digital controlled current sources DI1 and DI2.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A comparator outputting offset calibration, comprising:
   a MOS current mode logic (MCML) circuit, receiving input signals and generating differential logic signals on output terminals thereof, and comprising a calibration unit coupled to the output terminals, calibrating output offsets at the output terminals according to digital calibration codes; and
   an output stage coupled to the differential logic signals at the output terminals of the MCML circuit, amplifying the differential logic signals and generating a comparison resulting signal.

2. The comparator as claimed in claim 1, wherein the calibration codes comprise a first set of calibration codes and a second set calibration codes.

3. The comparator as claimed in claim 2, wherein the calibration units comprise two digital controlled current sources, generating corresponding current to calibrate the output offsets at the output terminals according to the first and second sets of calibration codes respectively.

4. The comparator as claimed in claim 3, wherein the digital controlled current sources each comprise:
   a plurality of PMOS transistors connected in parallel, wherein source terminals of the PMOS transistors are coupled to a power voltage, drain terminals are coupled to a first node, and gate terminals of which are coupled to a corresponding set of calibration codes;
   a first NMOS transistor comprising a drain terminal coupled to the first node, a source terminal coupled to a ground voltage, and a gate terminal coupled to the drain terminal thereof; and
   a second NMOS transistor comprising a source terminal coupled to the ground voltage, a gate terminal coupled to the gate terminal of the first NMOS transistor, and a drain terminal coupled to one of the output terminals of the MCML circuit.

5. The comparator as claimed in claim 1, wherein the MCML circuit further comprises:
   a differential input stage, comprising two input terminals receiving the input signals and a common node, and generating two corresponding output signals in a sampling mode;
   a latch unit, coupled to the differential input stage, generating the differential logic signals at the output terminals of the MCML circuit, according to the two output signals from the differential input stage, in a comparison mode, and comprising a first node; and
   means for pulling the common node to the power voltage in the comparison mode.

6. The comparator as claimed in claim 5, wherein the means for pulling the common node to the power voltage in the comparison mode is a first current source coupled between the power voltage and the common node of the differential input stage.

7. The comparator as claimed in claim 5, wherein the differential input stage comprises:
   two load elements coupled to output terminals of the differential input stage respectively;
   a third NMOS transistor comprising a source terminal coupled to the common node, a drain terminal coupled to one of the two load elements and a gate terminal; and
   a fourth NMOS transistor comprising a source terminal coupled to the common node, a drain terminal coupled to the other load element and a gate terminal, wherein the gate terminals of the third and fourth NMOS transistors are coupled to the input signals respectively.

8. The comparator as claimed in claim 7, wherein the latch unit comprises:
   a fifth NMOS transistor comprising a source terminal coupled to the first node, a drain terminal and a gate terminal; and
   a sixth NMOS transistor comprising a source terminal coupled to the first node, a gate terminal coupled to the drain terminal of the fifth NMOS transistor, and a drain terminal coupled to the gate terminal of the fifth NMOS transistor, wherein the drain terminals of the fifth and sixth NMOS transistor are coupled to the output terminal of the MCML circuit respectively.

9. The comparator as claimed in claim 5, wherein the MCML circuit further comprises:
   a differential pair comprising input terminals coupled to two clock signals, output terminals coupled to the common node and the first node respectively, and a second node; and
   a second current source coupled between the second node and the ground voltage.

10. The comparator as claimed in claim 9, wherein the two load elements comprise a third current source and a fourth current source, wherein the third current source is coupled between the drain terminal of the third NMOS transistor and the power voltage, and the fourth current source is coupled between the drain terminal of the fourth NMOS transistor and the power voltage.

11. The comparator as claimed in claim 9, wherein the different pair comprises:
    a seventh NMOS transistor comprising a drain terminal coupled to the common node of the differential input stage, a source terminal coupled to the second node, and a gate terminal coupled to one of the two of clock signals; and
    an eighth NMOS transistor comprising a drain terminal coupled to the first node, a source terminal coupled to the second node, and a gate terminal coupled to the other clock signal, wherein the two clock signals have inverse signals to each other.

12. The comparator as claimed in claim 5, wherein the MCML circuit further comprises a coupling unit coupled to input terminals of the differential input stage, coupling the input signals to the differential input stage.

13. A MOS current mode logic (MCML) circuit outputting offset calibration, comprising:
    a differential input stage, comprising two input terminals receiving input signals and a common node, and generating two corresponding output signals at two output terminals in a sampling mode;
    a latch unit, coupled to the differential input stage, generating differential logic signals at the two output terminals, according to the two output signals from the differential input stage, in a comparison mode, and comprising a first node; and
    a calibration unit coupled to the output terminals, calibrating output offsets at the output terminals according to digital calibration codes.

14. The MCML circuit as claimed in claim 13, wherein the calibration codes comprise a first set of calibration codes and a second set calibration codes.

15. The MCML circuit as claimed in claim 14, wherein the calibration units comprise two digital controlled current sources, generating corresponding current to calibrate the output offsets at the output terminals according to the first and second sets of calibration codes respectively.

16. The comparator as claimed in claim 15, wherein the digital controlled current sources each comprise:

a plurality of PMOS transistors connected in parallel, wherein source terminals of the PMOS transistors are coupled to a power voltage, drain terminals are coupled to a first node, and gate terminals of which are coupled to a corresponding set of calibration codes;

a first NMOS transistor comprising a drain terminal coupled to the first node, a source terminal coupled to a ground voltage, and a gate terminal coupled to the drain terminal thereof; and a second NMOS transistor comprising a drain terminal coupled to the ground voltage, a gate terminal coupled to the gate terminal of the first NMOS transistor, and a drain terminal coupled to one of the output terminals of the MCML circuit.

17. The MCML circuit as claimed in claim 13, wherein the MCML circuit further comprises means for pulling the common node to the power voltage in the comparison mode.

18. The MCML circuit as claimed in claim 17, wherein the means for pulling the common node to the power voltage in the comparison mode is a first current source coupled between the power voltage and the common node of the differential input stage.

19. The MCML circuit as claimed in claim 17, wherein the differential input stage comprises:

two load elements coupled to output terminals of the differential input stage respectively;

a third NMOS transistor comprising a source terminal coupled to the common node, a drain terminal coupled to one of the two load elements and a gate terminal; and a fourth NMOS transistor comprising a source terminal coupled to the common node, a drain terminal coupled to the other load element and a gate terminal, wherein the gate terminals of the third and fourth NMOS transistors are coupled to the input signals respectively.

20. The MCML circuit as claimed in claim 19, wherein the latch unit comprises:

a fifth NMOS transistor comprising a source terminal coupled to the first node, a drain terminal and a gate terminal; and a sixth NMOS transistor comprising a source terminal coupled to the first node, a gate terminal coupled to the drain terminal of the fifth NMOS transistor, and a drain terminal coupled to the gate terminal of the fifth NMOS transistor, wherein the drain terminals of the fifth and sixth NMOS transistor are coupled to the output terminal of the MCML circuit respectively.

21. The comparator as claimed in claim 17, wherein the MCML circuit further comprises:

a differential pair comprising input terminals coupled to two clock signals, output terminals coupled to the common node and the first node respectively, and a second node; and a second current source coupled between the second node and the ground voltage.

22. The MCML circuit as claimed in claim 21, wherein the two load elements comprise a third current source and a fourth current source, wherein the third current source is coupled between the drain terminal of the third NMOS transistor and the power voltage, and the fourth current source is coupled between the drain terminal of the fourth NMOS transistor and the power voltage.

23. The MCML circuit as claimed in claim 21, wherein the different pair comprises:

a seventh NMOS transistor comprising a drain terminal coupled to the first common node of the differential input stage, a source terminal coupled to the second node, and a gate terminal coupled to one of the two clock signals; and an eighth NMOS transistor comprising a drain terminal coupled to the first node, a source terminal coupled to the second node, and a gate terminal coupled to the other clock signal, wherein the two clock signals have inverse signals to each other.

24. The MCML circuit as claimed in claim 13, wherein the MCML circuit further comprising a coupling unit coupled to input terminals of the differential input stage, coupling the input signals to the differential input stage.

* * * * *